United States Patent [19]

Rowe

[11] Patent Number: 5,244,507

[45] Date of Patent: Sep. 14, 1993

[54] METHOD OF CLEANING EPOXY ARTICLES

[75] Inventor: Edward A. Rowe, Grand Island, N.Y.

[73] Assignee: Occidental Chemical Corporation, Niagara Falls, N.Y.

[21] Appl. No.: 857,559

[22] Filed: Mar. 25, 1992

[51] Int. Cl.$^5$ .................. B08B 3/04; B08B 7/00; C23D 17/00

[52] U.S. Cl. ................. 134/38; 134/40; 134/12; 252/172; 252/162; 252/DIG. 8

[58] Field of Search ............. 134/38, 40, 12, 38; 252/172, 162, DIG. 8

[56] References Cited

U.S. PATENT DOCUMENTS

| | | | |
|---|---|---|---|
| 2,971,919 | 2/1961 | Goldsmith | 252/DIG. 8 |
| 3,835,070 | 9/1974 | Beck | 252/DIG. 14 |
| 5,098,593 | 3/1992 | Rowe | 252/DIG. 8 |

OTHER PUBLICATIONS

DuPont Product Bulletin FS-27 no date.

*Primary Examiner*—Theodore Morris
*Assistant Examiner*—Zeinab El-Arvins
*Attorney, Agent, or Firm*—Wayne A. Jones; Richard D. Fuerle

[57] ABSTRACT

Disclosed is a method of removing synthetic and natural resins from an article containing an epoxy resin without damaging the epoxy resin. The article is contacted with a solvent having the formula

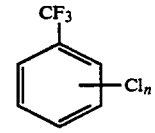

where n is 1 or 2, which dissolves the synthetic and natural resins and forms a solution. The solution is then separated from the article. The solvent can be recovered from the solution.

20 Claims, No Drawings

METHOD OF CLEANING EPOXY ARTICLES

BACKGROUND OF INVENTION

This invention relates to a method of cleaning articles that contain an epoxy resin. In particular, it relates to a method of removing undesirable synthetic and natural resins from those articles without dissolving the epoxy resin.

In the electronics industry, circuit boards are used that are made from epoxy resins. When components are mounted on the boards, rosins used as solder fluxes contaminate the surfaces of the board. Other synthetic and natural resins are used as adhesives, and they also end up as undesirable substances on the board. In addition, the board can be contaminated by human contact and by particles and gases from the air. In order to preserve the electrical properties of the board, it is necessary to remove these contaminants without damaging the board itself. This is accomplished by cleaning the board with a solvent that readily dissolves most synthetic and natural resins, but does not dissolve or attack the epoxy resin from which the board is constructed.

Until recently, trichlorotrifluoroethane was used for this purpose because it is a good solvent for most resins but does not attack epoxy resins. However, trichlorotrifluoroethane persists in the atmosphere and has been implicated in the depletion of the ozone layer. For this reason, its use has been restricted and it may be prohibited entirely within a few years. Efforts are being made to identify other solvents with the same desirable properties but which will not affect the ozone layer.

SUMMARY OF INVENTION

I have discovered that certain chlorinated benzotrifluoride compounds are, like trichlorotrifluoroethane, good solvents for many natural and synthetic resins, yet are very poor solvents for epoxies. This was an unexpected discovery because aromatic compounds are usually very good solvents and chlorinated aromatic compounds are especially good solvents. Thus, it was surprising to find that these compounds do not dissolve epoxy resins.

However, unlike trichlorotrifluoroethane, the chlorinated benzotrifluoride compounds of this invention are not expected to attack the ozone layer. Because about two years are required for a solvent released on the ground to reach the ozone layer in the stratosphere, and the solvents of this invention have an atmospheric life in the troposphere of only about sixty days, they should not be ozone depleters.

DESCRIPTION OF THE INVENTION

The solvents used in the process of this invention have the general formula:

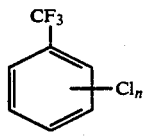

where n is 1 or 2. Monochlorobenzotrifluoride compounds (n=1) are preferred for applications requiring high solvent volatility, and dichlorobenzotrifluoride compounds (n=2) are preferred for applications requiring a high flash point. A high volatility is desirable when it is desirable to rapidly evaporate the solvent after it is used. The flash point is the temperature above which combustion over a liquid can occur; a high flash point is desirable in applications where flammability may be a problem.

Of the three monochlorobenzotrifluoride isomers, ortho chlorobenzotrifluoride and parachlorobenzotrifluoride (PCBTF) are preferred because the ortho isomer can be easily made from orthochlorotoluene and the para isomer is already commercially available. All the isomers can be obtained by chlorinating benzotrifluoride and separating them from the resulting mixture. Of the seven dichlorobenzotrifluoride (DCBTF) isomers, 3,4-dichlorobenzotrifluoride (3,4-DCBTF) is preferred because it is already a commercial product and 2,5-dichlorobenzotrifluoride is preferred because it can readily be obtained by chlorinating orthochlorobenzotrifluoride. The other dichlorobenzotrifluoride isomers can be obtained by chlorinating benzotrifluoride or a monochlorobenzotrifluoride.

The solvents can be used in a pure form or they can be mixed with various optional components to preserve or enhance their properties. For example, about 0.01 to about 1.0 wt % (based on total composition weight) of a stabilizer can be included with the solvent to trap decomposition products that may catalyze the decomposition of the solvent. Stabilizers include compounds such as epoxides, glycidyl ethers, and diepoxides. The preferred stabilizer is allyl glycidyl ether because it is available and its boiling point is close to the boiling point of the solvents.

About 0.0005 to about 0.1 wt % of an antioxidant can be included in the solvent to act as a free radical inhibitor by scavenging free radicals such as monoatomic oxygen. Examples of antioxidants include hindered phenols such as thymol, hydroquinone monomethyl ether, and tertiary amyl phenol. Other examples of antioxidants include nitrogen ring compounds such as N-methyl pyrolle. Hindered phenols are preferred due to their low cost and availability.

About 0.001 to about 0.1 wt % of a corrosion inhibitor can be included in the solvent to prevent it from attacking various metals with which it comes into contact. Examples of corrosion inhibitors include acetates, glycol ethers, imidazoles, and amines, such as ethyl morpholine and methyl morpholine. The preferred corrosion inhibitor is ethyl morpholine because of its good performance and availability.

The addition of about 0.5 to about 10.0 wt % of an oxygenated solvent such as an alcohol, ketone, glycol or glycol ether to the chlorobenzotrifluoride solvent may be desirable to improve the cleaning of ionic contaminants from solder fluxes. Examples of useful oxygenated solvents include amyl alcohol, butyl alcohol, hexyl alcohol, amyl acetate, butyl acetate, propylene glycol mono methyl ether, propylene glycol ether acetate, and/or propylene glycol methyl ether acetate. The selection of a specific oxygenated solvent is based on cleaning performance, recoverability with the chlorobenzotrifluoride solvent, and cost.

The chlorobenzotrifluorides can also be combined with water and an anionic surfactant to form an emulsion or a semi-aqueous cleaner. These cleaners offer solvent power for a specific cleaning job, but are less flammable and less expensive because they contain water. Useful surfactants include a $C_{10}$ to $C_{14}$ sulfated or sulfonated anionic surfactant such as sodium dodecyl benzene sulfonate, ammonium salts of a sulfonated $C_{10}$ to $C_{14}$ alcohol-ethylene oxide condensation product, and the ammonium salt of the sulfated condensation product of ethylene oxide and dodecanol. A preferred composition is about 0.5 to about 10 wt % of the chlorobenzotrifluoride, about 0.5 to about 10 wt % anionic surfactant, and the balance water. See U.S. Pat. No. 3,835,070, herein incorporated by reference, for additional details.

Any article that contains an epoxy resin and is contaminated with a synthetic or natural resin can be cleaned using the process of this invention. Such articles include printed circuit boards, magnetic tape, coaxial wire, copier equipment, office machines, electronic components and equipment, glass products, instruments and meters, jewelry, metals, medical equipment, and plastic and rubber products.

In the cleaning process of this invention, the contaminated article is contacted or washed with the chlorinated benzotrifluoride solvent. Washing is typically done for about 30 to about 60 seconds at room temperature. One part can be washed by itself or many parts can be washed together. The amount of solvent used depends upon the shape of the parts and the number of parts and the type and amount of contaminant. The contaminants dissolve in the solvent and the solution of the contaminants, carrying entrained soil particles, is separated from the article. Recovery of the solvent from the solution is accomplished by evaporating the solvent and condensing its vapors. In practice, an article to be cleaned is washed in stages with the used solvent from the later stages being reused in the earlier stages. The solvent used in the earliest stage is recovered and is recycled back to the last stage. Because the solvents of this invention are expensive and are combustible, they are preferably used in a closed system and are recovered after use. Such a closed system would include a treatment chamber where the parts to be cleaned are washed with the solvent, and a separate solvent recovery chamber where the solvent is evaporated to recover it. Evaporation can be accomplished by heating, such as by infrared light, or by vacuum, or a combination of heat and vacuum. The solvent vapors are passed to a condensor where the solvent is condensed back to a liquid. The cleaning of articles can be accomplished in either a batch or a continuous process.

The following example further illustrates this invention.

EXAMPLE

Using ASTM Test D1545-89, the solubility of various resins in a variety of solvents was determined. The kinematic viscosity (in centipoises) was also determined at the solubility limit. The resins tested were those commonly used as industrial adhesives. The solvents tested were PCBTF and 3,4-DCBTF, which are within the scope of this invention, and a blend of 20 vol % PCBTF—50 vol % orthochlorotoluene (OCT)—30 vol % perchloroethylene (PCE) ("20—50—30"), a blend of 50 vol % PCBTF—50 vol % OCT ("50—50—0"), a blend of 30 vol % PCBTF—20 vol % OCT—50 vol % perchloroethylene ("30—20—50"), and OCT. The following table gives the wt % solubility (the number in parenthesis is the viscosity).

| Type of Resin | Volume % PCBTF-OCT-PCE | | | OCT | PCBTF | 3,4-DCBTF |
| | 20-50-30 | 50-50-0 | 30-20-50 | | | |
|---|---|---|---|---|---|---|
| DOW D.E.R. 661R | 50 | 53 | 56 | 65 | <3 | <3 |
| (Epoxy) | (2831) | (1901) | (5740) | (7040) | — | — |
| AMOCO INDOPOL H100 | >70 | >70 | >70 | >70 | >70 | >70 |
| (Polybutenes) | | | | | | |
| Durez Resin 29095 | 58 | 60 | 54 | 65 | 53 | 45 |
| (Phenolic) | (1624) | (2662) | (1426) | (6600) | (1332) | (154) |
| Goodyear Wingtack Extra | 65 | 61 | 64 | 70 | 58 | 53 |
| (Polyterpene Hydrocarbon) | (3131) | (776) | (4067) | (6710) | (384) | (373) |
| Goodyear Vitel PE 200 | 36 | 42 | 40 | 40 | 31 | 25 |
| (Phthalate Ester) | (19572) | (34197) | (100407) | — | (9948) | (12580) |
| Goodyear Vitel PE 307 | 38 | 39 | 37 | 40 | 34 | 26 |
| (Phthalate Ester) | (14699) | (24621) | (20511) | (13310) | (8617) | (4422) |
| Hercules Staybelite Ester 10 | 67 | 69 | 67 | 75 | 60 | 55 |
| (Hydrogenated Rosin Glyceride) | (1365) | (2530) | (1947) | (4180) | (502) | (221) |
| Monsanto Gelva GMS 788 | >70 | >70 | >70 | >70 | >70 | >70 |
| (Acrylate Copolymers In Solvent) | | | | | | |
| Shell Krayton D 1107P | 38 | 27 | 30 | 30 | 32 | 31 |
| (Styrene Rubber Block Polymers) | (4620) | (18720) | (5068) | (7920) | (31900) | (59249) |

The table shows that PCBTF and 3,4-DCBTF dissolved less than 3 wt % of the epoxy resin (3 wt % was the limit of the accuracy of the test), while the epoxy resin was very soluble in the other solvents tested. The table also shows that the other resins tested are nearly as soluble in PCBTF and 3,4-DCBTF as they are in the other solvents tested.

I claim:

1. A method of removing synthetic and natural resins, other than epoxy resins, from an article containing an epoxy resin without damage to said epoxy resin comprising
 (A) contacting the said article with a solvent having the formula

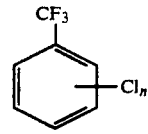

where n is 1 or 2, to dissolve said synthetic and natural resins into said solvent and form a solution thereof; and
 (B) separating said solution from said article.

2. A method according to claim 1 including the additional last step of recovering said solvent from said solution.

3. A method according to claim 2 when said solvent is recovered by evaporating said solvent using heat, a vacuum, or both heat and a vacuum.

4. A method according to claim 2 wherein said recovered solvent is recycled to step (A).

5. A method according to claim 1 wherein said article is contacted with said solvent in at least two stages, where the solvent used in each later stage is used in the preceding earlier stage, and the solvent used in the earliest stage is recovered and used in the last stage.

6. A method according to claim 1 wherein said article is selected from the group consisting of printed circuit boards, magnetic tape, coaxial wire, copier equipment, office machines, electronic components and equipment, glass products, instruments and meters, jewelry, metals, medical equipment, and plastic and rubber products.

7. A method according to claim 6 wherein said solvent is parachlorobenzotrifluoride.

8. A method according to claim 6 wherein said solvent is orthochlorobenzotrifluoride.

9. A method according to claim 1 wherein n is 2.

10. A method according to claim 9 wherein said solvent is 3,4-dichlorobenzotrifluoride.

11. A method according to claim 9 wherein said solvent is 2,5-dichlorobenzotrifluoride.

12. A method according to claim 1 wherein said article is a circuit board.

13. A method according to claim 1 wherein said solvent includes about 0.01 to about 1.0 wt % of a stabilizer.

14. A method according to claim 13 wherein said stabilizer is allyl glycidyl ether.

15. A method according to claim 1 wherein said solvent includes about 0.0005 to about 1 wt % of a antioxidant.

16. A method according to claim 15 wherein said antioxidant is a hindered phenol.

17. A method according to claim 1 wherein said solvent includes about 0.001 to about 0.1 wt % of a corrosion inhibitor.

18. A method according to claim 17 wherein said corrosion inhibitor is ethyl morpholine.

19. A method of cleaning an article made from an epoxy resin which is contaminated with another resin comprising
    (A) placing said article in a treatment chamber;
    (B) washing said article in said treatment chamber with a liquid solvent having the formula

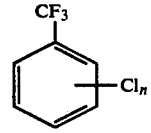

where n is 1 or 2;
    (C) transporting solvent used in said treatment chamber to a solvent recovery chamber;
    (D) vaporizing said solvent in said solvent recovery chamber;
    (E) transporting said solvent vapors to a condenser; and
    (F) condensing said solvent vapors in said condensor to form a liquid solvent.

20. A method according to claim 19 wherein said article is a circuit board.

* * * * *